United States Patent
Wang et al.

(10) Patent No.: US 10,102,784 B2
(45) Date of Patent: Oct. 16, 2018

(54) K VALUE DETECTION METHOD OF OLED DRIVE THIN FILM TRANSISTOR

(71) Applicant: Shenzhen China Star Optoelectronics Technology Co., Ltd., Shenzhen (CN)

(72) Inventors: Limin Wang, Shenzhen (CN); Taijiun Hwang, Shenzhen (CN); Pengfei Liang, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 38 days.

(21) Appl. No.: 15/508,098

(22) PCT Filed: Feb. 15, 2017

(86) PCT No.: PCT/CN2017/073622
§ 371 (c)(1),
(2) Date: Mar. 1, 2017

(87) PCT Pub. No.: WO2018/120368
PCT Pub. Date: Jul. 5, 2018

(65) Prior Publication Data
US 2018/0226006 A1     Aug. 9, 2018

(51) Int. Cl.
*G09G 3/00* (2006.01)
*H01L 27/32* (2006.01)
(Continued)

(52) U.S. Cl.
CPC .......... *G09G 3/006* (2013.01); *G09G 3/3233* (2013.01); *G09G 3/3258* (2013.01);
(Continued)

(58) Field of Classification Search
CPC ............. G09G 3/006; G09G 3/3233; G09G 2310/0262; G09G 3/3258; G09G 3/3291; H01L 27/326
See application file for complete search history.

(56) References Cited

U.S. PATENT DOCUMENTS

2006/0054893 A1* 3/2006 Nathan ............... G09G 3/3233
257/72
2011/0248276 A1* 10/2011 Son ..................... H01L 21/0245
257/65
(Continued)

FOREIGN PATENT DOCUMENTS

CN          105321455 A       2/2016

*Primary Examiner* — Muhammad N Edun
(74) *Attorney, Agent, or Firm* — Leong C. Lei

(57) ABSTRACT

The present invention provides a K value detection method of an OLED drive thin film transistor. The method sets the data signal to provide two different data voltages to make the drive thin film transistor form two different gate-source voltages, and then the currents flowing through the drive thin film transistor under the two different gate-source voltages are detected by the external detection process circuit, and the central process unit calculates and obtains the threshold voltage of the OLED drive thin film transistor according to the two gate-source voltages, the two current data and the formula based on the current formula for the driving thin film transistor. The present invention can accurately acquires the K value of the drive thin film transistor of each pixel in the OLED display element to improve the K value compensation result of the OLED drive thin film transistor for promoting the OLED display quality.

15 Claims, 2 Drawing Sheets

(51) Int. Cl.
*G09G 3/3233* (2016.01)
*G09G 3/3258* (2016.01)
*G09G 3/3291* (2016.01)

(52) U.S. Cl.
CPC ....... *G09G 3/3291* (2013.01); *H01L 27/3262* (2013.01); *G09G 2310/0262* (2013.01)

(56) References Cited

U.S. PATENT DOCUMENTS

2013/0057532 A1* 3/2013 Lee .................. G09G 3/3225
345/211
2016/0064421 A1* 3/2016 Oh .................... H01L 27/1222
257/43

* cited by examiner providing an OLED display device drive system, comprising a sub pixel driving circuit (1) and a detection process circuit (2) electrically coupled to the sub pixel driving circuit (1); the sub pixel driving circuit (1) comprises: a first thin film transistor (T1), a second thin film transistor (T2), a third thin film transistor (T3), a first capacitor (C1) and an organic light emitting diode (D1); a gate of the first thin film transistor (T1) receiving a scan signal (Scan), and a source receiving a data signal (Data), and a drain being electrically coupled to a first node (P); a gate of the second thin film transistor (T2) being electrically coupled to the first node (P), and a source being electrically coupled to a second node (Q), and a drain receiving a direct current voltage signal (Ovdd); a gate of the third thin film transistor (T3) receiving a detection signal (Sen), and a source being electrically coupled to the second node (Q), and a drain being electrically coupled to the detection process circuit (2); one end of the first capacitor (C1) being electrically coupled to the first node (P), and the other end being electrically coupled to the second node (Q); an anode of the organic light emitting diode (D1) being electrically coupled to the second node (Q), and a cathode is grounded; the second thin film transistor (T2) being a drive thin film transistor; the detection process circuit (2) comprising: a current integrator (21) electrically coupled to the drain of the third thin film transistor (T3), a CDS sampler (22) electrically coupled to the current integrator (21), an analog to digital converter (23) electrically coupled to the CDS sampler (22) and a central process unit (24) electrically coupled to the analog to digital converter (23); — S1 the scan signal (Scan) and the detection signal (Sen) providing high voltage levels at the same time, and the first thin film transistor (T1) and the third thin film transistor (T3) being on at the same time, and the data signal (Data) writing a first data voltage to the gate of the second thin film transistor (T2), and the second thin film transistor (T2) being on, and the detection process circuit (2) detecting a source voltage of the second thin film transistor (T2) and a current flowing through the second thin film transistor (T2) to obtain a first source voltage and a first current data, and saving the first data voltage, the first source voltage and the first current data in the central process unit (24); — S2 both the scan signal (Scan) and the detection signal (Sen) being kept at the high voltage level, and both the first thin film transistor (T1) and the third thin film transistor (T3) being kept to be on, and the data signal (Data) writing a second data voltage, which is different from the first data voltage to the gate of the second thin film transistor (T2), and the second thin film transistor (T2) being on, and the detection process circuit (2) detecting a source voltage of the second thin film transistor (T2) and a current flowing through the second thin film transistor (T2) to obtain a second source voltage and a second current data, and saving the second data voltage, the second source voltage and the second current data in the central process unit (24), and a set integration time of the current integrator (21) as detecting the current flowing through the second thin film transistor (T2) is the same as a set integration time of the current integrator (21) as detecting the current flowing through the second thin film transistor (T2) in step S2; — S3 the central process unit (24) calculating and obtaining a K value of the second thin film transistor (T2) according to a default formula and the first data voltage, the first source voltage, the first current data, the second data voltage, the second source voltage and the second current data which are saved;

the default formula is: $K = \frac{C}{\Delta T} \left( \frac{\sqrt{Data_{I1}} - \sqrt{Data_{I2}}}{V_{gs1} - V_{gs2}} \right)^2$.

wherein K is the K value of the second thin film transistor (T2), and $Data_{I1}$ is the first current data, and $Data_{I2}$ is the second current data, and $V_{gs1}$ is a difference value of the first data voltage and the first source voltage, and $V_{gs2}$ is a difference value of the second data voltage and the second source voltage, and C is a capacitance value of the current integrator (21), and $\Delta T$ is the set integration time of the current integrator. — S4

Fig. 2

K VALUE DETECTION METHOD OF OLED DRIVE THIN FILM TRANSISTOR

FIELD OF THE INVENTION

The present invention relates to a display technology field, and more particularly to a K value detection method of an OLED drive thin film transistor.

BACKGROUND OF THE INVENTION

The Organic Light Emitting Display (OLED) possesses many outstanding properties of self-illumination, low driving voltage, high luminescence efficiency, short response time, high clarity and contrast, near 180° view angle, wide range of working temperature, applicability of flexible display and large scale full color display. The OLED is considered as the most potential display device.

The OLED display device generally comprises a substrate, an anode located on the substrate, a Hole Injection Layer located on the anode, a Hole Transporting Layer located on the Hole Injection Layer, an emitting layer located on the Hole Transporting Layer, an Electron Transport Layer located on the emitting layer, an Electron Injection Layer located on the Electron Transport Layer and a Cathode located on the Electron Injection Layer. The principle of the OLED is that the illumination generates due to the carrier injection and recombination under the electric field driving of the semiconductor material and the organic semiconductor illuminating material. Specifically, the (Indium Tin Oxide) ITO pixel electrode and the metal electrode are respectively employed as the anode and the cathode of the Display. Under certain voltage driving, the Electron and the Hole are respectively injected into the Electron and Hole Transporting Layers from the cathode and the anode. The Electron and the Hole respectively migrate from the Electron and Hole Transporting Layers to the Emitting layer and bump into each other in the Emitting layer to form an exciton to excite the emitting molecule. The latter can illuminate after the radiative relaxation.

The OLED can be categorized into two major types according to the driving methods, which are the Passive Matrix OLED (PMOLED) and the Active Matrix OLED (AMOLED), i.e. two types of the direct addressing and the Thin Film Transistor (TFT) matrix addressing. The AMOLED comprises pixels arranged in array and belongs to active display type, which has high lighting efficiency and is generally utilized for the large scale display devices of high resolution.

The AMOLED is a current driving element. When the electrical current flows through the organic light emitting diode, the organic light emitting diode emits light, and the brightness is determined according to the current flowing through the organic light emitting diode itself. Most of the present Integrated Circuits (IC) only transmit voltage signals. Therefore, the AMOLED pixel driving circuit needs to accomplish the task of converting the voltage signals into the current signals. The traditional AMOLED pixel driving circuit generally is 2T1C, which is a structure comprising two thin film transistors and one capacitor to convert the voltage into the current.

Generally, the AMOLED pixel driving circuit comprises a drive thin film transistor of driving the organic light emitting diode to emit light. During use, because the aging of the organic light emitting diode and the threshold voltage shift of the drive thin film transistor will lead to the display quality descending of the OLED display device, the prior art compensates the threshold voltage of the drive thin film transistor during use of the OLED display device. The formula for the current flowing through the organic light emitting diode is:

$$I_{ds} = \frac{1}{2}\mu_n C_{ox} \frac{W}{L}(V_{gs} - V_{th})^2,$$

wherein Ids is the current flowing through the organic light emitting diode, and $\mu_n$ is the carrier mobility of the drive thin film transistor, and Cox is a capacitance of a gate oxide layer per unit area, and $$\frac{W}{L}$$

is a channel width to length ratio, and $V_{gs}$ is a gate-source voltage of the drive thin film transistor, and $V_{th}$ is the threshold voltage of the drive thin film transistor; a value of $$\frac{1}{2}\mu_n C_{ox}\frac{W}{L}$$

is so called a K value of the drive thin film transistor, and the K value also will drift during use of the drive thin film transistor, and the drift of the K value will influence the performance of the drive thin film transistor to lead to the display quality descending of the OLED display device. Therefore, except the compensation to the threshold voltage during use of the OLED display device, it is further required to detect and compensate the K value of the drive thin film transistor to ensure the display quality of the OLED display device during use.

SUMMARY OF THE INVENTION

An objective of the present invention is to provide a K value detection method of an OLED drive thin film transistor, which can accurately detect the K value of the OLED drive thin film transistor to improve the K value compensation result of the OLED drive thin film transistor for promoting the OLED display quality.

For realizing the aforesaid objectives, the present invention provides a K value detection method of an OLED drive thin film transistor, comprising steps of:

step S1, providing an OLED display device drive system, comprising a sub pixel driving circuit and a detection process circuit electrically coupled to the sub pixel driving circuit;

the sub pixel driving circuit comprises: a first thin film transistor, a second thin film transistor, a third thin film transistor, a first capacitor and an organic light emitting diode;

a gate of the first thin film transistor receiving a scan signal, and a source receiving a data signal, and a drain being electrically coupled to a first node; a gate of the second thin film transistor being electrically coupled to the first node, and a source being electrically coupled to a second node, and a drain receiving a direct current voltage signal; a gate of the third thin film transistor receiving a detection signal, and a source being electrically coupled to the second node, and a drain being electrically coupled to the detection process circuit; one end of the first capacitor being electrically coupled to the first node, and the other end being electrically coupled to the second node; an anode of the organic light emitting diode being electrically coupled to the second node, and a cathode is grounded;

the second thin film transistor being a drive thin film transistor;

the detection process circuit comprising: a current integrator electrically coupled to the drain of the third thin film transistor, a CDS sampler (correlated double sampler) electrically coupled to the current integrator, an analog to digital converter electrically coupled to the CDS sampler and a central process unit electrically coupled to the analog to digital converter;

step S2, the scan signal and the detection signal providing high voltage levels at the same time, and the first thin film transistor and the third thin film transistor being on at the same time, and the data signal writing a first data voltage to the gate of the second thin film transistor, and the second thin film transistor being on, and the detection process circuit detecting a source voltage of the second thin film transistor and a current flowing through the second thin film transistor to obtain a first source voltage and a first current data, and saving the first data voltage, the first source voltage and the first current data in the central process unit;

step S3, both the scan signal and the detection signal being kept at the high voltage level, and both the first thin film transistor and the third thin film transistor being kept to be on, and the data signal writing a second data voltage, which is different from the first data voltage to the gate of the second thin film transistor, and the second thin film transistor being on, and the detection process circuit detecting a source voltage of the second thin film transistor and a current flowing through the second thin film transistor to obtain a second source voltage and a second current data, and saving the second data voltage, the second source voltage and the second current data in the central process unit, and a set integration time of the current integrator as detecting the current flowing through the second thin film transistor is the same as a set integration time of the current integrator as detecting the current flowing through the second thin film transistor in step S2;

step S4, the central process unit calculating and obtaining a K value of the second thin film transistor according to a default formula and the first data voltage, the first source voltage, the first current data, the second data voltage, the second source voltage and the second current data which are saved;

the default formula is:

$$K = \frac{C}{\Delta T}\left(\frac{\sqrt{Data_{I1}} - \sqrt{Data_{I2}}}{V_{gs1} - V_{gs2}}\right)^2;$$

wherein K is the K value of the second thin film transistor, and $Data_{I1}$ is the first current data, and $Data_{I2}$ is the second current data, and $V_{gs1}$ is a difference value of the first data voltage and the first source voltage, and $V_{gs2}$ is a difference value of the second data voltage and the second source voltage, and C is a capacitance value of the current integrator, and $\Delta T$ is the set integration time of the current integrator.

In step S2 and step S3, a process of detecting the current flowing through the second thin film transistor is:

first, the current integrator integrating the current flowing through the second thin film transistor, and after integration of the current integrator is accomplished, the CDS sampler collecting an output of the current integrator, and then the analog to digital converter converting an output of an analog signal into a digital signal to obtain the current data and saving the current data in the central process unit.

A relationship of the current data and the current flowing through the second thin film transistor is:

$$I_{ds} = Data_I \times C/\Delta T;$$

wherein $I_{ds}$ is the current flowing through the second thin film transistor, and $Data_I$ is the current data.

The central process unit is a FPGA process system.

A parasitic capacitance is further formed in the sub pixel driving circuit, and the parasitic capacitance is coupled with two ends of the organic light emitting diode in parallel.

The K value detection method of the OLED drive thin film transistor further comprises: step S5, repeating steps S2 to S4 a plurality of times to perform multiple detections to obtain a plurality of K values of the second thin film transistor, and taking an average value of the plurality of K values of the second thin film transistor as a final K value of the second thin film transistor.

A different first data voltage and a different second data voltage are used for each detection.

The first thin film transistor, the second thin film transistor and the third thin film transistor are low temperature polysilicon thin film transistors, amorphous silicon thin film transistors or oxide semiconductor thin film transistors.

The detected K value of the second thin film transistor is used for compensation for the K value of the second thin film transistor.

The present invention further provides a K value detection method of an OLED drive thin film transistor, comprising steps of:

step S1, providing an OLED display device drive system, comprising a sub pixel driving circuit and a detection process circuit electrically coupled to the sub pixel driving circuit;

the sub pixel driving circuit comprises: a first thin film transistor, a second thin film transistor, a third thin film transistor, a first capacitor and an organic light emitting diode;

a gate of the first thin film transistor receiving a scan signal, and a source receiving a data signal, and a drain being electrically coupled to a first node; a gate of the second thin film transistor being electrically coupled to the first node, and a source being electrically coupled to a second node, and a drain receiving a direct current voltage signal; a gate of the third thin film transistor receiving a detection signal, and a source being electrically coupled to the second node, and a drain being electrically coupled to the detection process circuit; one end of the first capacitor being electrically coupled to the first node, and the other end being electrically coupled to the second node; an anode of the organic light emitting diode being electrically coupled to the second node, and a cathode is grounded;

the second thin film transistor being a drive thin film transistor;

the detection process circuit comprising: a current integrator electrically coupled to the drain of the third thin film transistor, a CDS sampler (correlated double sampler) electrically coupled to the current integrator, an analog to digital converter electrically coupled to the CDS sampler and a central process unit electrically coupled to the analog to digital converter;

step S2, the scan signal and the detection signal providing high voltage levels at the same time, and the first thin film transistor and the third thin film transistor being on at the same time, and the data signal writing a first data voltage to the gate of the second thin film transistor, and the second thin film transistor being on, and the detection process circuit detecting a source voltage of the second thin film transistor and a current flowing through the second thin film transistor to obtain a first source voltage and a first current data, and saving the first data voltage, the first source voltage and the first current data in the central process unit;

step S3, both the scan signal and the detection signal being kept at the high voltage level, and both the first thin film transistor and the third thin film transistor being kept to be on, and the data signal writing a second data voltage, which is different from the first data voltage to the gate of the second thin film transistor, and the second thin film transistor being on, and the detection process circuit detecting a source voltage of the second thin film transistor and a current flowing through the second thin film transistor to obtain a second source voltage and a second current data, and saving the second data voltage, the second source voltage and the second current data in the central process unit, and a set integration time of the current integrator as detecting the current flowing through the second thin film transistor is the same as a set integration time of the current integrator as detecting the current flowing through the second thin film transistor in step S2;

step S4, the central process unit calculating and obtaining a K value of the second thin film transistor according to a default formula and the first data voltage, the first source voltage, the first current data, the second data voltage, the second source voltage and the second current data which are saved;

the default formula is:

$$K = \frac{C}{\Delta T}\left(\frac{\sqrt{Data_{I1}} - \sqrt{Data_{I2}}}{V_{gs1} - V_{gs2}}\right)^2;$$

wherein K is the K value of the second thin film transistor, and $Data_{I1}$ is the first current data, and $Data_{I2}$ is the second current data, and $V_{gs1}$ is a difference value of the first data voltage and the first source voltage, and $V_{gs2}$ is a difference value of the second data voltage and the second source voltage, and C is a capacitance value of the current integrator, and $\Delta T$ is the set integration time of the current integrator;

wherein the central process unit is a FPGA process system;

wherein the first thin film transistor, the second thin film transistor and the third thin film transistor are low temperature polysilicon thin film transistors, amorphous silicon thin film transistors or oxide semiconductor thin film transistors;

wherein the detected K value of the second thin film transistor is used for compensation for the K value of the second thin film transistor;

The benefits of the present invention are: the present invention provides a K value detection method of an OLED drive thin film transistor. The method sets the data signal to provide two different data voltages to make the drive thin film transistor form two different gate-source voltages, and then the currents flowing through the drive thin film transistor under the two different gate-source voltages are detected by the external detection process circuit, and the central process unit calculates and obtains the K value of the OLED drive thin film transistor according to the two gate-source voltages, the two current data and the formula based on the current formula for the driving thin film transistor.

The present invention can accurately acquires the K value of the drive thin film transistor of each pixel in the OLED display element to improve the K value compensation result of the OLED drive thin film transistor for promoting the OLED display quality.

BRIEF DESCRIPTION OF THE DRAWINGS

In order to better understand the characteristics and technical aspect of the invention, please refer to the following detailed description of the present invention is concerned with the diagrams, however, provide reference to the accompanying drawings and description only and is not intended to be limiting of the invention.

In drawings,

FIG. 2 is a flowchart of a K value detection method of an OLED drive thin film transistor according to the present invention.

DETAILED DESCRIPTION OF PREFERRED EMBODIMENTS

Figure 1:
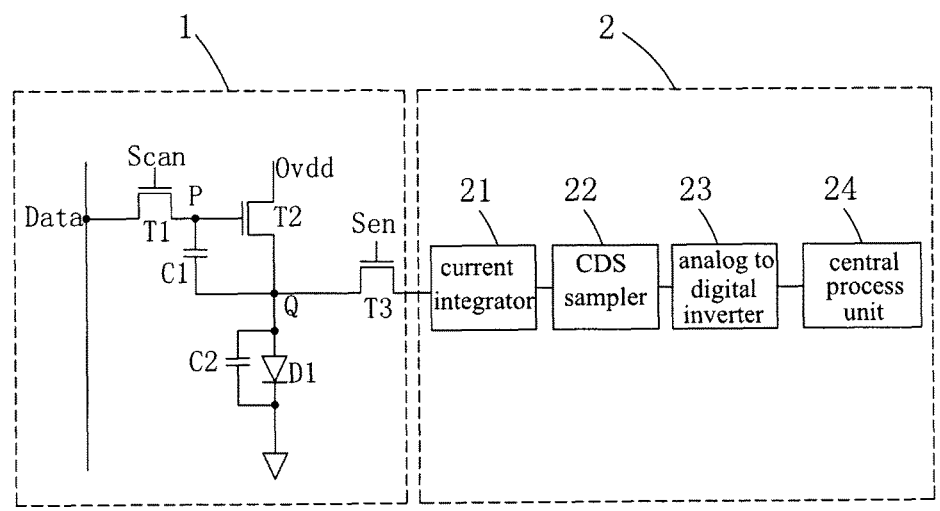
FIG. 1 is a circuit diagram of an OLED display device drive system in a K value detection method of an OLED drive thin film transistor according to the present invention.

For better explaining the technical solution and the effect of the present invention, the present invention will be further described in detail with the accompanying drawings and the specific embodiments.

Please refer to FIG. 2. The present invention provides a K value detection method of an OLED drive thin film transistor, comprising steps of:

step S1, referring to FIG. 1, providing an OLED display device drive system, comprising a sub pixel driving circuit 1 and a detection process circuit 2 electrically coupled to the sub pixel driving circuit 1;

the sub pixel driving circuit 1 comprises: a first thin film transistor T1, a second thin film transistor T2, a third thin film transistor T3, a first capacitor C1 and an organic light emitting diode D1;

a gate of the first thin film transistor T1 receiving a scan signal Scan, and a source receiving a data signal Data, and a drain being electrically coupled to a first node P; a gate of the second thin film transistor T2 being electrically coupled to the first node P, and a source being electrically coupled to a second node Q, and a drain receiving a direct current voltage signal Ovdd; a gate of the third thin film transistor T3 receiving a detection signal, and a source being electrically coupled to the second node Q, and a drain being electrically coupled to the detection process circuit 2; one end of the first capacitor C1 being electrically coupled to the first node P, and the other end being electrically coupled to the second node Q; an anode of the organic light emitting diode D1 being electrically coupled to the second node Q, and a cathode is grounded;

the second thin film transistor T2 being a drive thin film transistor;

the detection process circuit 2 comprising: a current integrator 21 electrically coupled to the drain of the third thin film transistor T3, a CDS sampler (correlated double sampler) 22 electrically coupled to the current integrator 21, an analog to digital converter 23 electrically coupled to the CDS sampler 22 and a central process unit 24 electrically coupled to the analog to digital converter 23.

Preferably, the central process unit 24 can be a Field Programmable Gate Array (FPGA) process system. The first thin film transistor T1, the second thin film transistor T2 and the third thin film transistor T3 can be low temperature polysilicon thin film transistors, amorphous silicon thin film transistors or oxide semiconductor thin film transistors.

Besides, a parasitic capacitance C2 is further formed in the sub pixel driving circuit 1, and the parasitic capacitance C2 is coupled with two ends of the organic light emitting diode D1 in parallel.

step S2, the scan signal Scan and the detection signal Sen providing high voltage levels at the same time, and the first thin film transistor T1 and the third thin film transistor T3 being on at the same time, and the data signal Data writing a first data voltage to the gate of the second thin film transistor T2, and the second thin film transistor T2 being on, and the detection process circuit 2 detecting a source voltage of the second thin film transistor T2 and a current flowing through the second thin film transistor T2 to obtain a first source voltage and a first current data, and saving the first data voltage, the first source voltage and the first current data in the central process unit 24;

step S3, both the scan signal Scan and the detection signal Sen being kept at the high voltage level, and both the first thin film transistor T1 and the third thin film transistor T3 being kept to be on, and the data signal Data writing a second data voltage, which is different from the first data voltage to the gate of the second thin film transistor T2, and the second thin film transistor T2 being on, and the detection process circuit 2 detecting a source voltage of the second thin film transistor T2 and a current flowing through the second thin film transistor T2 to obtain a second source voltage and a second current data, and saving the second data voltage, the second source voltage and the second current data in the central process unit 24, and a set integration time of the current integrator 21 as detecting the current flowing through the second thin film transistor T2 is the same as a set integration time of the current integrator 21 as detecting the current flowing through the second thin film transistor T2 in step S2;

Specifically in step S2 and step S3, a process of detecting the current flowing through the second thin film transistor T2 is: first, the current integrator 21 integrating the current flowing through the second thin film transistor T2, and after integration of the current integrator 21 is accomplished, the CDS sampler 22 collecting an output of the current integrator 21, and then the analog to digital converter 23 converting an output of an analog signal into a digital signal to obtain the current data and saving the current data in the central process unit 24.

Furthermore, a relationship of the current data and the current flowing through the second thin film transistor T2 is: $I_{ds}=Data_I \times C/\Delta T$; wherein $I_{ds}$ is the current flowing through the second thin film transistor T2, and $Data_I$ is the current data, and C is a capacitance value of the current integrator 21, and $\Delta T$ is the set integral time of the current integrator 21, and a specific derivation process is: the current integrator 21 integrates the current flowing through the second thin film transistor T2 to obtain $$Data_I = \int I_{ds} \frac{dT}{C},$$

and $I_{ds}$ is the current flowing through the second thin film transistor T2, and the current $I_{ds}$ flowing through the second thin film transistor T2 under the same gate-source voltage is constant, and the capacitance C of the current integrator 21 is a fixed value, and the integral time $\Delta T$ is also a set fixed value, and therefore, $I_{ds}=Data_I \times C/\Delta T$.

The source voltage of the second thin film transistor T2 is detected by a common external detection method in prior art, and no detail description is repeated.

step S4, the central process unit 24 calculating and obtaining a K value of the second thin film transistor T2 according to a default formula and the first data voltage, the first source voltage, the first current data, the second data voltage, the second source voltage and the second current data which are saved;

the default formula is:

$$K = \frac{C}{\Delta T}\left(\frac{\sqrt{Data_{I1}} - \sqrt{Data_{I2}}}{V_{gs1} - V_{gs2}}\right)^2;$$

wherein K is the K value of the second thin film transistor T2, and $Data_{I1}$ is the first current data, and $Data_{I2}$ is the second current data, and $V_{gs1}$ is a difference value of the first data voltage and the first source voltage, and $V_{gs2}$ is a difference value of the second data voltage and the second source voltage, and C is a capacitance value of the current integrator 21, and $\Delta T$ is the set integration time of the current integrator 21.

Specifically, a specific derivation process of the default formula is: according to the current formula for the driving thin film transistor: $I_{ds}=K(V_{gs}-V_{th})2$, wherein K is a constant, and $V_{th}$ is a threshold voltage of the drive thin film transistor, and then, under the driving of the first data voltage, the current $I_{ds1}$ flowing through the second thin film transistor is: $I_{ds1}=K(V_{gs1}-V_{th})^2$, and under the driving of the second data voltage, the current $I_{ds2}$ flowing through the second thin film transistor is: $I_{ds2}=K(V_{gs2}-V_{th})^2$, and with the simultaneous deformation of the two formulas:

$$\sqrt{\frac{I_{ds1}}{K}} = V_{gs1} - V_{th}, \sqrt{\frac{I_{ds2}}{K}} = V_{gs2} - V_{th},$$

and then, with the subtraction of two formulas after deformation:

$$\sqrt{\frac{I_{ds1}}{K}} - \sqrt{\frac{I_{ds2}}{K}} = V_{gs1} - V_{gs2}, \text{ and } I_{ds1} = Data_{I1} \times C/\Delta T,$$

$$I_{ds2} = Data_{I2} \times C/\Delta T,$$

and after the respective substitution and simplification, $$K = \frac{C}{\Delta T}\left(\frac{\sqrt{Data_{I1}} - \sqrt{Data_{I2}}}{V_{gs1} - V_{gs2}}\right)^2.$$

Furthermore, the present invention further comprises: step 5, repeating steps S2 to S4 a plurality of times to perform multiple detections to obtain a plurality of K values of the second thin film transistor T2, and taking an average value of the plurality of K values of the second thin film transistor T2 as a final K value of the second thin film transistor T2. Step 5 uses the method of repeating steps S2 to S4 a plurality of times to perform multiple detections and take the average value. The accuracy of the acquired K value of the second thin film transistor T2 can be further promoted to improve the K value compensation result of the OLED drive thin film transistor for promoting the OLED display quality. Significantly, when multiple detection processes are used, a different first data voltage and a different second data voltage need to be used for each detection in general.

Specifically, the K value of the second thin film transistor T2 detected by the present invention can be used for compensation for the K value of the second thin film transistor T2. Because the detected K value of the second thin film transistor T2 is more accurate, the compensation result is better, and the OLED display quality is better.

In conclusion, the present invention provides a K value detection method of an OLED drive thin film transistor. The method sets the data signal to provide two different data voltages to make the drive thin film transistor form two different gate-source voltages, and then the currents flowing through the drive thin film transistor under the two different gate-source voltages are detected by the external detection process circuit, and the central process unit calculates and obtains the K value of the OLED drive thin film transistor according to the two gate-source voltages, the two current data and the formula based on the current formula for the driving thin film transistor. The present invention can accurately acquires the K value of the drive thin film transistor of each pixel in the OLED display element to improve the K value compensation result of the OLED drive thin film transistor for promoting the OLED display quality.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A K value detection method of an OLED drive thin film transistor, comprising steps of:
    step S1, providing an OLED display device drive system, comprising a sub pixel driving circuit and a detection process circuit electrically coupled to the sub pixel driving circuit;
    the sub pixel driving circuit comprises: a first thin film transistor, a second thin film transistor, a third thin film transistor, a first capacitor and an organic light emitting diode;
    a gate of the first thin film transistor receiving a scan signal, and a source receiving a data signal, and a drain being electrically coupled to a first node; a gate of the second thin film transistor being electrically coupled to the first node, and a source being electrically coupled to a second node, and a drain receiving a direct current voltage signal; a gate of the third thin film transistor receiving a detection signal, and a source being electrically coupled to the second node, and a drain being electrically coupled to the detection process circuit; one end of the first capacitor being electrically coupled to the first node, and the other end being electrically coupled to the second node; an anode of the organic light emitting diode being electrically coupled to the second node, and a cathode is grounded;
    the second thin film transistor being a drive thin film transistor;
    the detection process circuit comprising: a current integrator electrically coupled to the drain of the third thin film transistor, a CDS sampler (correlated double sampler) electrically coupled to the current integrator, an analog to digital converter electrically coupled to the CDS sampler and a central process unit electrically coupled to the analog to digital converter;
    step S2, the scan signal and the detection signal providing high voltage levels at the same time, and the first thin film transistor and the third thin film transistor being on at the same time, and the data signal writing a first data voltage to the gate of the second thin film transistor, and the second thin film transistor being on, and the detection process circuit detecting a source voltage of the second thin film transistor and a current flowing through the second thin film transistor to obtain a first source voltage and a first current data, and saving the first data voltage, the first source voltage and the first current data in the central process unit;
    step S3, both the scan signal and the detection signal being kept at the high voltage level, and both the first thin film transistor and the third thin film transistor being kept to be on, and the data signal writing a second data voltage, which is different from the first data voltage to the gate of the second thin film transistor, and the second thin film transistor being on, and the detection process circuit detecting a source voltage of the second thin film transistor and a current flowing through the second thin film transistor to obtain a second source voltage and a second current data, and saving the second data voltage, the second source voltage and the second current data in the central process unit, and a set integration time of the current integrator as detecting the current flowing through the second thin film transistor is the same as a set integration time of the current integrator as detecting the current flowing through the second thin film transistor in step S2;
    step S4, the central process unit calculating and obtaining a K value of the second thin film transistor according to a default formula and the first data voltage, the first source voltage, the first current data, the second data voltage, the second source voltage and the second current data which are saved;
    the default formula is:

$$K = \frac{C}{\Delta T} \left( \frac{\sqrt{Data_{I1}} - \sqrt{Data_{I2}}}{V_{gs1} - V_{gs2}} \right)^2 ;$$

wherein K is the K value of the second thin film transistor, and $Data_{I1}$ is the first current data, and $Data_{I2}$ is the second current data, and $V_{gs1}$ is a difference value of the first data voltage and the first source voltage, and $V_{gs2}$ is a difference value of the second data voltage and the second source voltage, and C is a capacitance value of the current integrator, and $\Delta T$ is the set integration time of the current integrator.

2. The K value detection method of the OLED drive thin film transistor according to claim 1, wherein in step S2 and step S3, a process of detecting the current flowing through the second thin film transistor is:
    first, the current integrator integrating the current flowing through the second thin film transistor, and after integration of the current integrator is accomplished, the CDS sampler collecting an output of the current integrator, and then the analog to digital converter converting an output of an analog signal into a digital signal to obtain the current data and saving the current data in the central process unit.

3. The K value detection method of the OLED drive thin film transistor according to claim 2, wherein a relationship of the current data and the current flowing through the second thin film transistor is:

$$I_{ds} = \text{Data}_I \times C / \Delta T;$$

wherein $I_{ds}$ is the current flowing through the second thin film transistor, and $\text{Data}_I$ is the current data.

4. The K value detection method of the OLED drive thin film transistor according to claim 1, wherein the central process unit is a FPGA process system.

5. The K value detection method of the OLED drive thin film transistor according to claim 1, wherein a parasitic capacitance is further formed in the sub pixel driving circuit, and the parasitic capacitance is coupled with two ends of the organic light emitting diode in parallel.

6. The K value detection method of the OLED drive thin film transistor according to claim 1, further comprising: step S5, repeating steps S2 to S4 a plurality of times to perform multiple detections to obtain a plurality of K values of the second thin film transistor, and taking an average value of the plurality of K values of the second thin film transistor as a final K value of the second thin film transistor.

7. The K value detection method of the OLED drive thin film transistor according to claim 6, wherein a different first data voltage and a different second data voltage are used for each detection.

8. The K value detection method of the OLED drive thin film transistor according to claim 1, wherein the first thin film transistor, the second thin film transistor and the third thin film transistor are low temperature polysilicon thin film transistors, amorphous silicon thin film transistors or oxide semiconductor thin film transistors.

9. The K value detection method of the OLED drive thin film transistor according to claim 1, wherein the detected K value of the second thin film transistor is used for compensation for the K value of the second thin film transistor.

10. A K value detection method of an OLED drive thin film transistor, comprising steps of:
    step S1, providing an OLED display device drive system, comprising a sub pixel driving circuit and a detection process circuit electrically coupled to the sub pixel driving circuit;
    the sub pixel driving circuit comprises: a first thin film transistor, a second thin film transistor, a third thin film transistor, a first capacitor and an organic light emitting diode;
    a gate of the first thin film transistor receiving a scan signal, and a source receiving a data signal, and a drain being electrically coupled to a first node; a gate of the second thin film transistor being electrically coupled to the first node, and a source being electrically coupled to a second node, and a drain receiving a direct current voltage signal; a gate of the third thin film transistor receiving a detection signal, and a source being electrically coupled to the second node, and a drain being electrically coupled to the detection process circuit; one end of the first capacitor being electrically coupled to the first node, and the other end being electrically coupled to the second node; an anode of the organic light emitting diode being electrically coupled to the second node, and a cathode is grounded;
    the second thin film transistor being a drive thin film transistor;
    the detection process circuit comprising: a current integrator electrically coupled to the drain of the third thin film transistor, a CDS sampler (correlated double sampler) electrically coupled to the current integrator, an analog to digital converter electrically coupled to the CDS sampler and a central process unit electrically coupled to the analog to digital converter;
    step S2, the scan signal and the detection signal providing high voltage levels at the same time, and the first thin film transistor and the third thin film transistor being on at the same time, and the data signal writing a first data voltage to the gate of the second thin film transistor, and the second thin film transistor being on, and the detection process circuit detecting a source voltage of the second thin film transistor and a current flowing through the second thin film transistor to obtain a first source voltage and a first current data, and saving the first data voltage, the first source voltage and the first current data in the central process unit;
    step S3, both the scan signal and the detection signal being kept at the high voltage level, and both the first thin film transistor and the third thin film transistor being kept to be on, and the data signal writing a second data voltage, which is different from the first data voltage to the gate of the second thin film transistor, and the second thin film transistor being on, and the detection process circuit detecting a source voltage of the second thin film transistor and a current flowing through the second thin film transistor to obtain a second source voltage and a second current data, and saving the second data voltage, the second source voltage and the second current data in the central process unit, and a set integration time of the current integrator as detecting the current flowing through the second thin film transistor is the same as a set integration time of the current integrator as detecting the current flowing through the second thin film transistor in step S2;
    step S4, the central process unit calculating and obtaining a K value of the second thin film transistor according to a default formula and the first data voltage, the first source voltage, the first current data, the second data voltage, the second source voltage and the second current data which are saved;
    the default formula is:

$$K = \frac{C}{\Delta T} \left( \frac{\sqrt{\text{Data}_{I1}} - \sqrt{\text{Data}_{I2}}}{V_{gs1} - V_{gs2}} \right)^2;$$

wherein K is the K value of the second thin film transistor, and $\text{Data}_{I1}$ is the first current data, and $\text{Data}_{I2}$ is the second current data, and $V_{gs1}$ is a difference value of the first data voltage and the first source voltage, and $V_{gs2}$ is a difference value of the second data voltage and the second source voltage, and C is a capacitance value of the current integrator, and $\Delta T$ is the set integration time of the current integrator;
wherein the central process unit is a FPGA process system;
wherein the first thin film transistor, the second thin film transistor and the third thin film transistor are low temperature polysilicon thin film transistors, amorphous silicon thin film transistors or oxide semiconductor thin film transistors;
wherein the detected K value of the second thin film transistor is used for compensation for the K value of the second thin film transistor.

11. The K value detection method of the OLED drive thin film transistor according to claim 10, wherein in step S2 and step S3, a process of detecting the current flowing through the second thin film transistor is:

first, the current integrator integrating the current flowing through the second thin film transistor, and after integration of the current integrator is accomplished, the CDS sampler collecting an output of the current integrator, and then the analog to digital converter converting an output of an analog signal into a digital signal to obtain the current data and saving the current data in the central process unit.

12. The K value detection method of the OLED drive thin film transistor according to claim 11, wherein a relationship of the current data and the current flowing through the second thin film transistor is:

$$I_{ds} = Data_I \times C / \Delta T;$$

wherein $I_{ds}$ is the current flowing through the second thin film transistor, and $Data_I$ is the current data.

13. The K value detection method of the OLED drive thin film transistor according to claim 10, wherein a parasitic capacitance is further formed in the sub pixel driving circuit, and the parasitic capacitance is coupled with two ends of the organic light emitting diode in parallel.

14. The K value detection method of the OLED drive thin film transistor according to claim 10, further comprising: step S5, repeating steps S2 to S4 a plurality of times to perform multiple detections to obtain a plurality of K values of the second thin film transistor, and taking an average value of the plurality of K values of the second thin film transistor as a final K value of the second thin film transistor.

15. The K value detection method of the OLED drive thin film transistor according to claim 14, wherein a different first data voltage and a different second data voltage are used for each detection.

* * * * *